United States Patent [19]

Sukegawa et al.

[11] 4,398,728
[45] Aug. 16, 1983

[54] PRESSURE SEAL STRUCTURE AND PRESSURE SEALED TRANSFER MECHANISM

[75] Inventors: Hiromu Sukegawa, Hitachioota; Yoshiaki Tomisawa, Hitachi, both of Japan

[73] Assignee: Hitachi Chemical Company, Limited, Tokyo, Japan

[21] Appl. No.: 270,101

[22] Filed: Jun. 3, 1981

[30] Foreign Application Priority Data

Jun. 10, 1980 [JP] Japan ............................ 55-78659

[51] Int. Cl.$^3$ ........................ F16J 15/32; F16J 15/46
[52] U.S. Cl. .............................. 277/12; 277/27; 277/DIG. 7; 34/242
[58] Field of Search .............. 277/12, 32, 237, DIG. 7, 277/27; 34/23, 242; 68/5 E

[56] References Cited

U.S. PATENT DOCUMENTS

| | | | |
|---|---|---|---|
| 3,061,943 | 11/1962 | Bennett et al. | 34/242 X |
| 3,299,676 | 1/1967 | Fujihashi | 34/242 X |
| 3,318,115 | 5/1967 | Fujihashi | 277/DIG. 7 X |
| 4,064,713 | 12/1977 | Sando et al. | 34/242 X |

FOREIGN PATENT DOCUMENTS 525032 4/1955 Italy ..................................... 34/242
53-31670 9/1978 Japan .

Primary Examiner—Robert S. Ward, Jr.
Attorney, Agent, or Firm—Birch, Stewart, Kolasch & Birch

[57] ABSTRACT

A seal structure for pressure sealing between a fixed member and a movable member. The seal structure is made of a flexible seal member formed with two opposite edges, one edge being fixed to the fixed member, while the other edge lies against and contacts the movable member. A free part of the flexible seal member between the two edges thereof is generally bent around, as seen from the free part of the flexible seal member closest to its fixed edge looking towards its free part closest to its contact edge. A first space is defined on the generally concave side of the flexible seal member, and a second space is defined on the generally convex side of the flexible seal member. A higher fluid pressure present in the first space presses the contact edge of the flexible seal member firmly against the movable member. A pressure sealed transfer mechanism including two rollers in contact with one another, and two such seal structures, for transferring a sheet between a higher pressure space and a lower pressure space, is also described.

7 Claims, 2 Drawing Figures

FIG. I
PRIOR ART
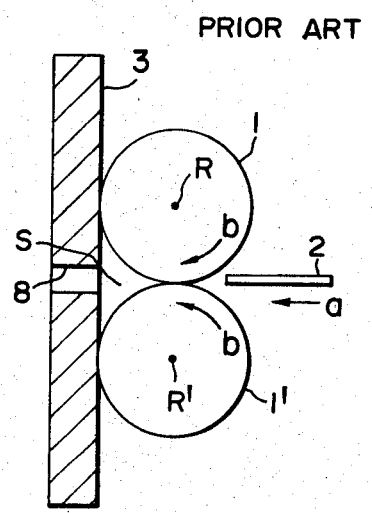
FIG. 2
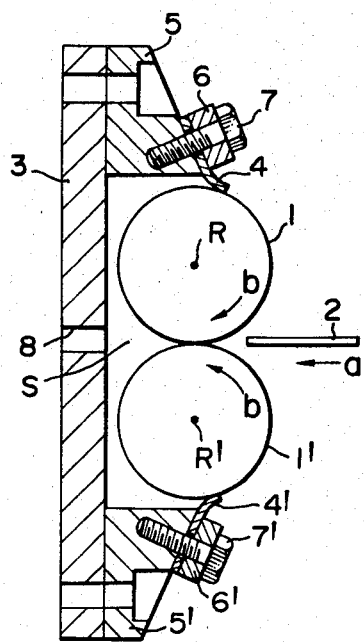

PRESSURE SEAL STRUCTURE AND PRESSURE SEALED TRANSFER MECHANISM

BACKGROUND OF THE INVENTION

The present invention relates to a pressure seal structure for sealing against a pressure difference between a fixed member and the surface of a movable member, and more particularly relates to a pressure seal structure for sealing against a pressure difference between a fixed member and the surface of a movable member, which is suitable for providing a pressure seal for the input or output side of a low pressure laminating machine such as a machine of a per se well known sort (for example, the machine disclosed in Japanese Patent Laying Open Publication No. 52-66581, or Japanese Patent Publication No. 53-31670) for laminating printed circuit boards at low pressure, when two such pressure seal structures are fitted so as to seal against two feed rollers of this laminating machine. The present invention also relates to a pressure sealed transfer mechanism comprising such a combination of two such pressure seal structures and two such feed or transfer rollers.

FIG. 1 is a sectional view of a prior art construction for inputing or feeding a sheet which is to be laminated into a low pressure laminating machine, for example of the sort disclosed in the above mentioned Japanese Patent Laying Open Publication No. 53-31670. In this figure, the reference numeral 1 denotes one of a pair of feed rollers, whose respective central rotational axes R and R' are parallel and extend in the plane perpendicular to the drawing paper, and the reference numeral 1' denotes the other of these feed rollers. These feed rollers 1 and 1' are typically rotatably supported at their extreme opposite portions in the directions perpendicular to the plane of the drawing paper in FIG. 1 by bearings or the like. Further, these feed rollers 1 and 1' are rotated respectively, as shown by the arrows denoted by the reference symbols b and b', in the clockwise and in the anticlockwise directions as seen in the drawing, and the feed roller 1 is in fairly tight contact with and pressed somewhat against the feed roller 1'. The feed rollers 1 and 1' are made of fairly resilient material, and thereby, as will be seen later, a fluid pressure seal is provided between their contact portions. A sheet 2, which is to be laminated by a low pressure laminating machine, and which may in some particular cases be a combination of sandwiched sheets which are to be laminated together, is directed to the feed rollers 1 and 1', being moved in the leftwards direction as shown by the arrow denoted by the reference symbol a in the drawing, so that its leading edge is entrapped, gripped, and fed by the feed rollers 1 and 1' in the leftwards direction as seen in the drawing.

The wall of the low pressure laminating machine into which the sheet 2 is to be fed is shown in section in FIG. 1, and is denoted by the reference numeral 3; the rest of this low pressure laminating machine is not shown, because its detailed structure is not relevant. This wall 3 is provided with a slot 8, through which the sheet 2 is required to pass, so that the sheet 2 can enter into the inside of the low pressure laminating machine. Thus, the slot 8 opposes the contact portions of the feed rollers 1 and 1'. As previously explained, the interior of the low pressure laminating machine is maintained at a low pressure, much lower than atmospheric pressure, and thus some form of sealing system is required to be provided, in order to stop atmospheric air from streaming in past the feed rollers 1 and 1' and through the slot 8, which would undesirably raise the pressure inside the laminating machine close to atmospheric pressure, thereby hampering or preventing proper lamination of the sheet 2 inside the laminating machine.

The prior art form of seal construction has been, as seen in FIG. 1, to insure that each of the feed rollers 1 and 1' to be in contact with and somewhat pressed against the wall 3 of the low pressure laminating machine, so as to form a pressure seal thereagainst, due to the above mentioned resilience of the feed rollers 1 and 1'. Further, as explained above, a pressure seal is provided between the contact portions of the feed rollers 1 and 1', because of the resilience of the feed rollers 1 and 1', both when no sheet 2 is being gripped by the feed rollers 1 and 1', as seen in FIG. 1, and also when a sheet 2 is being gripped by the feed rollers 1 and 1' and is being fed in the leftwards direction as seen in the figure through the slot 8 into the laminating machine. Thus, the space denoted in the figure by the symbol "S" located to the left in the drawing of the contact portions of the feed rollers 1 and 1' has been, in the above mentioned prior art, sealed against the entry of atmospheric air thereinto from the space at atmospheric pressure located to the right of the feed rollers 1 and 1' in the figure, and this sealing has ensured that large quantities of atmospheric air cannot enter through the slot 8 into the inside of the laminating machine, i.e. to the space on the left in the figure of the laminating machine wall 3.

However, this prior art form of construction for the input side of a low pressure laminating machine has encountered some problems, which mean that it is not really satisfactory.

In detail, the contact between the feed rollers 1 and 1' and the wall 3 of the laminating machine has tended to wear out both the wall 3 and also the feed rollers 1 and 1', because the material of the wall 3 is generally hard and not resilient. First, a consequence of this is that this wear may well cause deterioration of the sealing effect of the contact between the feed rollers 1 and 1' and the laminating machine wall 3, and also of the mutual contact between the feed rollers 1 and 1', due to irregularities on the feed rollers 1 and 1' and/or on the wall 3 caused by such wear. Second, another consequence is that detached pieces, principally of the feed rollers 1 and 1' which are generally softer and more liable to become destructively worn, but also of the wall 3, may adhere to the feed rollers 1 and 1' and may then be carried around by the rotation of the feed rollers 1 and 1', and may thus tend to be transferred to the surface of the sheet 2 which is being fed into the laminating machine. This is very troublesome, and can cause problems with regard to the quality of the laminated products such as printed circuit boards which are being made by the laminating machine, because such detached pieces can undesirably become sandwiched into the structure of these laminated products, after lamination thereof by the laminating machine. It should be noted that this particular problem is much less serious on the output side of a laminating machine, because there is no possiblity of such detached pieces of the output feed rollers becoming laminated into products produced by the laminating machine, when said detached pieces are deposited on the laminated products as they are being ejected from the laminating machine at the output side thereof.

This problem is aggravated by a particular result of the shown prior art construction, as follows. Because the feed rollers 1 and 1' are necessarily made of somewhat resilient material, as a matter of course they are somewhat flexible, even if reinforced. Now, the forces due to imbalance between the atmospheric pressure acting on the portions of the surfaces of the feed rollers 1 and 1' exposed thereto, and the low pressure inside the laminating machine acting on the portions of the surfaces of the feed rollers 1 and 1' exposed thereto, are very considerable, because as may be seen in the drawing major portions of the surfaces of these feed rollers 1 and 1' are exposed to the outside atmosphere, and also major portions of the surfaces of these feed rollers 1 and 1' are exposed to the low pressure inside the laminating machine. Accordingly, the forces due to the difference in these pressures are liable to cause some bending or bowing of the feed rollers 1 and 1', i.e. displacement of the central portions of the spans thereof, with regard to the extent of these feed rollers 1 and 1' in the direction perpendicular to the plane of the drawing paper in FIG. 1, respectively in the downwards and leftwards direction in FIG. 1, and in the upwards and leftwards direction therein. Any such bowing will cause the contact pressures between the feed rollers 1 and 1' and the wall 3 of the laminating machine to be sharply increased, especially at the above mentioned central parts of the spans of the feed rollers 1 and 1', i.e. at the parts of the feed rollers 1 and 1' where these feed rollers are not supported by bearings or the like. Of course, this uncontrolled increase in these contact pressures will cause a substantial increase in wear of the laminating machine wall 3 and also of the feed rollers 1 and 1', and thus will aggravate the above described problems of the prior art sealing system.

SUMMARY OF THE INVENTION

Accordingly, it is the primary object of the present invention to provide a seal structure which can provide a good seal between a fixed member and the surface of a movable member.

It is a further object of the present invention to provide a seal structure for sealing between a fixed member and the surface of a movable member, which provides a seal which is tightened by a pressure difference which it withstands.

It is a further object of the present invention to provide a seal structure for making a seal between a fixed member and the surface of a movable member, which incorporates a flexible seal member.

It is a further object of the present invention to provide a seal structure for making a seal between a fixed member and the surface of a movable member, which incorporates a flexible seal member, and in which the flexible seal member is made of an appropriate material.

It is a further object of the present invention to provide a seal structure for making a seal between a fixed member and the surface of a movable member, which can conform to slight irregularities or displacements of the movable member.

It is a further object of the present invention to provide a seal structure for making a seal between a fixed member and the surface of a roller, which can compensate for bending or bowing of the roller, without deterioration of the sealing function provided.

It is a further object of the present invention to provide a seal structure for making a seal between a fixed member and the surface of a roller, which roller, which can compensate for bending or bowing of the roller, without the likelihood of undue wear on the roller or on the seal structure occurring.

It is a yet further object of the present invention to provide an effective pressure sealed transfer mechanism for transferring a sheet from a high pressure space to a low pressure space, without letting substantial quantities of fluid leak from said high pressure space to said low pressure space.

It is a yet further object of the present invention to provide such a pressure sealed transfer mechanism, wherein the sealing effect provided thereby is tightened by the pressure difference between said high and said low pressure spaces which it withstands.

It is a yet further object of the present invention to provide such a pressure sealed transfer mechanism incorporating flexible seal members.

It is a yet further object of the present invention to provide such a pressure sealed transfer mechanism, incorporating flexible seal members, in which the seal is not disturbed by distortions in the mechanism caused by the effects of said high pressure and said low pressure.

It is a yet further object of the present invention to provide such a pressure sealed transfer mechanism, incorporating flexible seal members, in which the flexible seal members are made of an appropriate material.

It is a still further object of the present invention to provide such a pressure sealed transfer mechanism, in which distortions in the mechanism caused by the effects of said high pressure and said low pressure do not cause quick wearing of said flexible seal elements.

It is a still yet further object of the present invention to provide such a pressure sealed transfer mechanism, in which two rollers which revolve while in mutual contact transfer said sheet from said high pressure space to said low pressure space.

It is a still yet further object of the present invention to provide such a pressure sealed transfer mechanism, in which bowing of said rollers does not cause any substantial problem.

It is a still yet further object of the present invention to provide such a pressure sealed transfer mechanism, in which deposition of detached parts of said rollers upon said sheet which is being transferred is rendered unlikely.

According to the present invention, these and other objects are accomplished by a seal structure for sealing between a fixed member and the surface of a movable member, and for defining a first space containing a fluid at a higher pressure on one side of said seal structure and a second space containing a fluid at a lower pressure on the other side of said seal structure, comprising a flexible seal member formed with two opposite edges, one of said two edges being fixed to said fixed member, and the other of said two edges lying against and contacting said surface of said movable member, a free part of said flexible seal member between said two edges thereof being generally bent so that said first space is defined on the generally concave side of said flexible seal member and said second space is defined on the generally convex side of said flexible seal member.

According to such a structure, the higher fluid pressure present in said first space presses said contact edge of said flexible seal member firmly against said surface of said movable member.

Further, according to a particular aspect of the present invention, said surface of said movable member is moved in such a predetermined direction that said surface of said movable member tends to drag said contact edge of said flexible seal member in the general direction in which said flexible seal member is already extended, so as to straighten out said flexible seal member.

Further, according to a particular aspect of the present invention, these and other objects are more particularly and concretely accomplished by such a seal structure as described above, wherein a part of said flexible seal member extending along said contact edge thereof lies against and is in sealing contact with said surface of said movable member, said first space lying on the side of said contact part of said seal member opposite from the side thereof which contacts said surface of said movable member.

According to such a structure, the higher fluid pressure present in said first space presses said contact part of said flexible seal member firmly against said surface of said movable member so as to cause a good fluid seal to be formed therebetween and, as said surface of said movable member moves in said predetermined direction of movement thereof, said surface of said movable member tends to drag said contact surface of said flexible seal member in the general direction in which said flexible seal member is already extended, so as to unrumple said contact part of said flexible seal member even when said flexible seal member is relatively thin and so as to straighten said contact part of said flexible seal member out against and in sealing contact with said surface of said movable member.

Further, according to a more particular aspect of the present invention, these and other objects are more particularly and concretely accomplished by a seal structure for sealing between a fixed member and a cylindrical roller which has a predetermined direction of rotation and which extends generally parallel to said fixed member, and for defining a first space containing a fluid at a higher pressure on one side of said seal structure and a second space containing a fluid at a lower pressure on the other side of said seal structure, said predetermined direction of rotation of said roller being the direction which generally leads points on its surface past said seal structure from said second space to said first space, comprising a flexible seal member, extending generally parallel to said roller and said fixed member, formed with two opposite edges also extending generally parallel to said roller and said fixed member, one of said two edges being fixed to said fixed member, and the other of said two edges lying against and contacting said roller generally along a generatrix thereof, a free part of said flexible seal member between said two edges thereof being generally bent around, as seen from the part of said free part of said flexible seal member closest to said fixed edge thereof looking towards the part of said free part of said flexible seal member closest to said contact edge thereof, towards the direction which is said predetermined direction of rotation of said roller; said first space being defined on the generally concave side of said flexible seal member, and said second space being defined on the generally convex side of said flexible seal member.

According to such a structure, because the movable member is particularly a roller, since the surface of a rotating roller does not substantially undulate at all, the seal made by such a flexible seal member will be particularly effective.

Further, according to another aspect of the present invention, these and other objects are accomplished by a pressure sealed transfer mechanism for transferring a sheet between a first space on one side of said transfer mechanism containing a fluid at a higher pressure and a second space on the other side of said transfer mechanism containing a fluid at a lower pressure, comprising: two rollers, whose central rotational axes extend generally parallel to one another, and which are in contact along a line which is a generatrix of both of them; and two seal structures, one corresponding to each one of said rollers, each said seal structure comprising: a fixed member which extends generally parallel to said one roller; and a flexible seal member, extending generally parallel to said one roller and said fixed member, formed with two opposite edges also extending generally parallel to said one roller and said fixed member, one of said two edges being fixed to said fixed member, and the other of said two edges lying against and contacting said one roller generally along a generatrix thereof, a free part of said flexible seal member between said two edges thereof being generally bent so that said first space is defined on the generally concave sides of said flexible seal members and said second space is defined on the generally convex sides of said flexible seal members.

According to such a structure, the higher fluid pressure present in said first space presses said contact edges of said flexible seal members firmly against said rollers. In this case, also, if said rollers rotate in their rotational directions which cause their portions where they contact one another to move in the direction from said first space towards said second space, said rollers tend to drag said contact edges of said flexible seal members in the general directions in which said flexible seal members are already extended, so as to straighten out said flexible seal members.

Further, according to yet other particular aspects of the present invention, these and other objects are yet more particularly and concretely accomplished by a sealing structure and by a pressure sealed transfer construction of the sorts described above, wherein the flexible sealing members are made either of polyester film, Teflon sheet, aluminium vapor deposited polyester film, other sorts of plastic sheet, or composite material made up of a metallic film and a plastic material. These materials have been found to be particularly suitable and appropriate.

BRIEF DESCRIPTION OF THE DRAWINGS

The present invention will now be shown and described with reference to a preferred embodiment thereof, and with reference to the accompanying drawings. It should be clearly understood, however, that the description of the embodiment, and the drawings, are all of them given purely for the purposes of explanation and description only, and are none of them intended to be limitative of the scope of the present invention in any way, since the scope of the present invention is to be defined solely by the legitimate and proper scope of the appended claims. In the drawings:

FIG. 1 is a sectional view through a prior art construction for feeding a sheet for lamination into a low pressure laminating machine, said construction being attached to the wall of the laminating machine, the shown section being taken perpendicularly to the central rotational axes of two feed rollers for transporting the sheet incorporated in the construction, and showing a prior art way of ensuring a pressure seal at this input end of the machine, wherein the feed rollers make sealing contact against the machine wall; and FIG. 2 is a sectional view, taken in a fashion similar to FIG. 1, showing a pressure sealed transfer mechanism according to one aspect of the present invention for feeding a sheet for lamination into a low pressure laminating machine, said mechanism incorporating two feed rollers, this mechanism incorporating two pressure seal structures according to another aspect of the present invention for ensuring a pressure seal against atmospheric pressure at the input end of this machine, said pressure seal structures providing pressure seals against said two feed rollers.

DESCRIPTION OF THE PREFERRED EMBODIMENT

The present invention will now be described with reference to a preferred embodiment thereof, and with reference to the appended drawings. In FIG. 2, there is shown, in a fashion similar to FIG. 1, a preferred embodiment of the pressure sealed transfer mechanism according to the present invention, which incorporates two examples of the preferred embodiment of the seal structure according to the present invention, and which is provided at the input side of a low pressure laminating machine. In FIG. 2, parts of the preferred embodiment of the pressure sealed transfer mechanism according to the present invention shown which correspond to parts of the prior art construction shown in FIG. 1, and which have the same functions, are designated by the same reference symbols as in that figure; and also spaces and arrows shown in FIG. 2 which correspond to spaces and arrows shown in FIG. 1 are designated by the same reference letters as in that figure.

In this pressure sealed transfer mechanism, two feed rollers, designated by the reference symbols 1 and 1' respectively, whose respective central rotational axes R and R' are parallel and extend in the plane perpendicular to the drawing paper, are provided. These feed rollers 1 and 1' are rotatably supported at their extreme opposite portions in the directions perpendicular to the plane of the drawing paper in FIG. 2 by bearings or the like. Further, these feed rollers 1 and 1' are rotated respectively, as shown by the arrows denoted by the reference symbols b and b', in the clockwise and in the anticlockwise directions as seen in the drawing, and the feed roller 1 is in fairly tight contact with and pressed somewhat against the feed roller 1'. The feed rollers 1 and 1' are made of fairly resilient material, and thereby a fluid pressure seal is provided between their contact portions. A sheet 2, which is to be laminated by the low pressure laminating machine, and which again may be a combination of sandwiched sheets which are to be laminated together, is approached to the feed rollers 1 and 1', being moved in the leftwards direction as shown by the arrow denoted by the reference symbol a in the drawing, so that its leading edge is entrapped, gripped, and fed by the feed rollers 1 and 1' in the leftwards direction as seen in the drawing.

The wall of the low pressure laminating machine into which the sheet 2 is to be fed is denoted in FIG. 2 by the reference numeral 3; the rest of this low pressure laminating machine is not shown, because its detailed structure is not relevant to the present invention. This wall 3 is provided with a slot 8, through which it is required to pass the sheet 2, so that the sheet 2 should enter into the inside of the low pressure laminating machine. Thus, the slot 8 opposes the contact portions of the feed rollers 1 and 1'. As in the previous case, the interior of the low pressure laminating machine is kept at a low pressure, much lower than atmospheric pressure, and thus some form of sealing system is required to be provided, in order to stop atmospheric air streaming in past the feed rollers 1 and 1' and through the slot 8, which would undesirably raise the pressure inside the laminating machine close to atmospheric pressure, thereby hampering or preventing proper lamination of the sheet 2 inside the laminating machine.

In the pressure sealed transfer mechanism according to the present invention, as in the above described prior art shown in FIG. 1, a pressure seal is available between the contact portions of the feed rollers 1 and 1', because of the resilience of the feed rollers 1 and 1', both when no sheet 2 is being gripped by the feed rollers 1 and 1', as seen in FIG. 2, and also when a sheet 2 is being gripped by the feed rollers 1 and 1' and is being fed in the leftwards direction as seen in the figure through the slot 8 into the laminating machine. However, in the pressure sealed transfer mechanism according to the present invention, as opposed to that of the above described prior art shown in FIG. 1, the feed rollers 1 and 1' are not in contact with the wall 3 of the low pressure laminating machine, and thus do not perform any pressure sealing thereagainst. The pressure seal against each of the rollers, in the pressure sealed transfer mechanism according to the present invention, is made by one of the seal structures according to the present invention, and thus two preferred embodiments of the seal structure according to the present invention are comprised in the pressure sealed transfer mechanism according to the present invention, and are shown in FIG. 2.

Each of these seal structures according to the present invention, parts in the lower one of which as seen in FIG. 2 are designated by the same reference numerals as are the corresponding parts in the upper seal structure as seen in FIG. 2 with the addition of a prime, comprises a seal member 4 or 4', which is formed of a flexible material such as, for example: polyester film, Teflon (this is a registered trademark for polytetrafluoroethylene) sheet, aluminium vapor deposited polyester film, other sorts of plastic sheet, or composite material made up of a metallic film and a plastic material. The seal member 4 or 4' is formed as a long strip extending in the plane perpendicular to the drawing paper in FIG. 2, and a strip of the seal member 4 or 4' extending along one of the long edges of the seal member 4 or 4' is clamped by a plurality of clamping bolts 7 or 7', only one of which can be seen in the figure, with the interposition of a long clamping bar 6 or 6' formed with a plurality of holes for passing the shanks of the clamping bolts 7 or 7', to a mounting member 5 or 5' which is fixed to the wall 3 of the low pressure laminating machine. Both the clamping bar 6 or 6' and the mounting member 5 or 5' are also formed as long members extending in the plane perpendicular to the drawing paper in FIG. 2. Further, the mounting member 5 or 5' is formed as a solid member without any holes therein, so that fluid cannot pass therethrough.

The part of the seal member 4 or 4' which is not clamped by the clamping bar 6 or 6' and the bolts 7 or 7' to the mounting member 5 or 5' is bent around, as seen in FIG. 2, towards the direction of rotation of the feed roller 1 or 1' which corresponds thereto, and the long edge of the seal member 4 or 4' remote from the clamping bar 6 or 6' is in contact with the outer surface of this feed roller 1 or 1'. It will be likely that in fact not only this long edge of the seal member 4 or 4', but also a strip part of the surface of the seal member 4 or 4' extending along this long edge, will be in contact with said outer surface of the feed roller 1 or 1', but this is not strictly necessary for the present invention. As will be readily understood, based upon the foregoing disclosure, because the space generally to the right of the feed rollers 1 and 1' in FIG. 2 is at atmospheric pressure, therefore the low pressure present within the space denoted in the figure by the symbol "S" and located to the left in the drawing of the contact portions of the feed rollers 1 and 1', which is transmitted to the space S through the slot 8 from the inside of the laminating machine which is being continuously evacuated by some means such as a vacuum pump, sucks the free part of the seal member 4 or 4', i.e. the part of said seal member 4 or 4' which is not clamped by the clamping bar 6 or 6' and the bolts 7 or 7' to the mounting member 5 or 5', against the part of the outer surface of the feed roller 1 or 1' proximate thereto. Thereby a good seal of the seal member 4 or 4' against the outer surface of its corresponding feed roller 1 or 1' is positively assured.

Because the feed rollers 1 and 1' are rotating respectively in the clockwise and the anticlockwise directions as seen in FIG. 2, thereby their outer surfaces tend to drag the free parts of the seal members 4 and 4' along with them, in the directions, as seen in the figure, which tend to extend these seal strips 4 and 4' against the outer surfaces of these feed rollers 1 and 1', and to unrumple these seal strips, if they are relatively thin and by any chance they should have become rumpled or folded.

Thereby, the space denoted in the figure by the symbol "S" located to the left in the drawing of the contact portions of the feed rollers 1 and 1' is, by the function of the pressure sealed transfer mechanism according to the present invention, as well as in the above mentioned prior art shown in FIG. 1, sealed against the entry of atmospheric air thereinto from the atmospheric pressure available to the right of the feed rollers 1 and 1' in the figure, which thus ensures that substantial quantities of atmospheric air cannot enter through the slot 8 into the inside of the laminating machine, i.e. to the space on the left in the figure of the laminating machine wall 3.

When the feed rollers 1 and 1' are to rotate in the directions opposite to those in FIG. 2, as in the case where the sealing structure of the present invention is used at the outlet side of a low pressure laminating machine, then said feed roller 1 or 1' would tend to rumple its flexible seal member 4 or 4'. However, such a problem is solved by making the flexible seal members 4 and 4' thicker and tougher and longer so that they have free ends which extend for a small length beyond the contact lines along which they are pressed against the rollers 1 and 1' respectively, by the pressure difference due to the vacuum in the space S.

Now, with regard to the previously mentioned problem present in the prior art, that, because the feed rollers 1 and 1' are necessarily made of somewhat resilient material and thus are somewhat flexible, thereby, due to imbalance between the atmospheric pressure acting on the portions of the surfaces of the feed rollers 1 and 1' exposed thereto and the low pressure inside the laminating machine acting on the portions of the surfaces of the feed rollers 1 and 1' exposed thereto, bending or bowing of the feed rollers 1 and 1', i.e. displacement of the central portions of the spans thereof, is liable to occur: in the prior art such bowing caused the contact pressures between the feed rollers 1 and 1' and the wall 3 of the laminating machine to be sharply increased, especially at the central parts of the spans of the feed rollers 1 and 1', and such increase in these contact pressures was liable to cause much increased wear of the laminating machine wall 3 and also of the feed rollers 1 and 1'. However, by contrast, in the preferred embodiment of the pressure sealed transfer mechanism according to the present invention shown in FIG. 2, any such bowing of the feed rollers 1 and 1', although it may occur, has no substantial effect on the performance of the seal structures according to the present invention, because the flexible seal members 4 and 4' adapt themselves easily to such bowing, and because such bowing does not substantially alter the pressure with which these flexible seal members are pressed against their feed rollers 1 and 1'. This is a very important advantage of the pressure sealed transfer mechanism according to the present invention.

Although the present invention has been shown and described with reference to a preferred embodiment thereof, and in terms of the illustrative drawings, it should not be considered as limited thereby. Various possible modifications, omissions, and alterations could be conceived of by one skilled in the art to the form and the content of any particular embodiment, without departing from the scope of the present invention. For example, the seal structure according to the present invention is not limited to sealing against a roller, but may be applied to sealing against the surface of any movable member, such as a moving plane surface. Therefore it is desired that the scope of the present invention, and of the protection sought to be granted by Letters Patent, should be defined not by any of the perhaps purely fortuitous details of the shown embodiment, or of the drawings, but solely by the scope of the appended claims, which follow.

What is claimed is:

1. A pressure sealed transfer mechanism for transferring a sheet between an outside space of said transfer mechanism containing a fluid at a higher pressure and an inside space of said transfer mechanism containing a fluid at a lower pressure, comprising;
    two rollers, whose central rotational axes extend generally parallel to one another, and which are in sealing contact along a line which is a generatrix of both of them; and
    two sealing structures, one corresponding to each one of said rollers, each said seal structure comprising:
        a fixed member which extends generally parallel to said one roller; and
        a flexible seal member, extending generally parallel to said one roller and said fixed member, formed with two opposite edges also extending generally parallel to said one roller and said fixed member, one of said two edges being sealing fixed to said fixed member, and the other of said two edges lying against and sealingly contacting said one roller generally along a generatrix thereof, a free part of said flexible seal member between said two edges thereof being generally bent so that said outside space is defined on the generally concave sides of said flexible seal members and said inside space is defined on the generally convex sides of said flexible seal members;
    whereby the higher fluid pressure present in said outside spaces presses said contact edges of said flexible seal members firmly against said rollers.

2. A pressure sealed transfer mechanism according to claim 1, wherein said flexible seal members both are formed of polyester film.

3. A pressure sealed transfer mechanism according to claim 1, wherein said flexible seal members both are formed of polytetrafluoroethylene sheet.

4. A pressure sealed transfer mechanism according to claim 1, wherein said flexible seal members both are formed of aluminium vapor deposited polyester film.

5. A pressure sealed transfer mechanism according to claim 1, wherein said flexible seal members both are formed of plastic sheet.

6. A pressure sealed transfer mechanism according to claim 1, wherein said flexible seal members both are formed of a composite material made up of a metallic film and a plastic material.

7. A pressure sealed transfer mechanism according to claim 1 wherein each of the seal structures operatively cooperate with the respective rollers on the opposite sides of said rollers from the point where said rollers are in sealing contact with each other.

* * * * *